(12) United States Patent
Braunisch (10) Patent No.: US 9,093,990 B2
(45) Date of Patent: Jul. 28, 2015

(54) MATRIX MATCHING CROSSTALK REDUCTION DEVICE AND METHOD

(71) Applicant: Intel Corporation, Santa Clara, CA (US)

(72) Inventor: Henning Braunisch, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/031,438

(22) Filed: Sep. 19, 2013

(65) Prior Publication Data

US 2015/0077157 A1   Mar. 19, 2015

(51) Int. Cl.
*H03K 17/16* (2006.01)
*H03K 3/013* (2006.01)
*H03K 19/00* (2006.01)

(52) U.S. Cl.
CPC ............ *H03K 3/013* (2013.01); *H03K 19/0005* (2013.01)

(58) Field of Classification Search
USPC ............................................................ 326/30
See application file for complete search history.

(56) References Cited

U.S. PATENT DOCUMENTS 6,417,675 B1 *   7/2002   Johnson ..................... 324/601

* cited by examiner

*Primary Examiner* — Jany Richardson
(74) *Attorney, Agent, or Firm* — Schwegman Lundberg & Woessner, P.A.

(57) ABSTRACT

This disclosure relates generally to devices, systems, and methods that include conductive lines configured to transmit electrical signals between a first electronic component and a second electronic component between which the conductive lines are coupled. The devices, systems, and methods further include a transmitter, configured to generate the electrical signals, the transmitter including a source impedance based, at least in part, on a resistive coupling between individual ones of the conductive lines, a source impedance matrix of the source impedance being substantially proportional to the characteristic impedance matrix of the plurality of conductive lines.

18 Claims, 5 Drawing Sheets

MATRIX MATCHING CROSSTALK REDUCTION DEVICE AND METHOD

TECHNICAL FIELD

The disclosure herein relates generally to a device and method for reducing crosstalk between conductive lines in an electronic circuit.

BACKGROUND

Electronic circuits include conductive lines for the transmission of electrical signals between circuit components. Chip packages, printed circuit boards, and the like conventionally include conductive lines embedded in an insulator. Advances in technology have conventionally made such electronic circuits smaller and data rates higher. As the distance between conductive lines shrink, field effects may cause an electrical signal on one line to be manifested on a nearby line, a phenomenon known as crosstalk. Increases in data rates may exacerbate the effect of crosstalk by increasing a likelihood that such crosstalk may interfere with a signal on the nearby line.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The bandwidth of conductive lines, such as between silicon dies in a chip package, can be scaled by increasing the signaling rate, the number of conductive lines, or both. Bandwidth scaling may become limited by crosstalk. When wave propagation is not purely transverse electromagnetic (TEM), due to a non-uniform dielectric background, such as for microstrip geometries or due to conductor loss, balancing of the capacitive and inductive coupling between lines can reduce crosstalk, such as by deliberately increasing the capacitive coupling. Such balancing may reduce transmission line far-end crosstalk (FEXT) at the expense of increased transmission line near-end crosstalk (NEXT). NEXT may be induced, at least in part, by parasitic capacitance in the circuit. Active FEXT cancellation may tend to increase total circuit components with a resultant increase in die and/or package size and power consumption.

Multimode signaling may reduce crosstalk within a defined collection of conductive lines by utilizing multiconductor transmission line (MTL) theory. An on-die modal encoder may be positioned proximate a transmitter and a corresponding decoder may be positioned proximate a receiver. Binary multimode signaling may move the modal encoder from the transmitter to the receiver or, alternatively, the decoder from the receiver to the transmitter. S-parameter-based multimode signaling may reduce crosstalk on channels having discontinuities. Multimode signaling may also address transmission line FEXT, similar to capacitive-inductive balancing as discussed herein.

A crosstalk reduction mechanism has been developed that may mitigate the effect of near-end crosstalk (NEXT). Coupling between neighboring conductive lines may be utilized to reduce NEXT. Crosstalk reduction by matrix matching may be effective in reducing NEXT in circumstances including, but not limited to, low power interfaces, such as buses between a central processing unit (CPU) die and a memory die or die stack on a common multichip package (MCP). If the receiver ends of the lines are left unterminated, such as to conserve power, NEXT that propagates from the near end to the far end may appear as noise at the receiver, potentially degrading signal integrity. Crosstalk reduction by matrix matching may not utilize the grouping of conductive lines into bundles of predetermined size, in contrast to other techniques discussed above. Additionally, crosstalk reduction by matrix matching may be applied outside of MCPs and without regard to uniform or non-uniform dielectric backgrounds (e.g., in micro strip and strip line structures).

Crosstalk reduction by matrix matching may be applied in either the current or voltage domains. The matrix match may utilize a Thevenin formulation in the voltage domain and a Norton formulation in the current domain. The voltage domain may leave the receiver unmodified while the current domain may leave the transmitter unmodified. Both the voltage and current domains may be utilized advantageously in both data reading and data writing circumstances to reduce NEXT. In circumstances with a conductive line dedicated to writing, the voltage domain may be advantageous while in circumstances with the conductive line dedicated to reading, the current domain may be advantageous.

Figure 1:
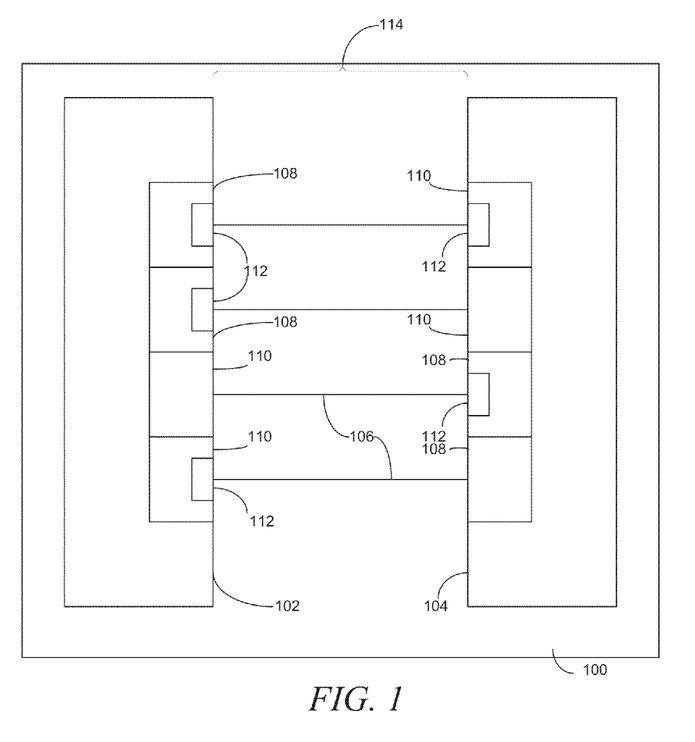
FIG. 1 is a simplified, cutaway, top profile of a chip package, in an example embodiment.

FIG. 1 is a simplified, cutaway, top profile of a chip package 100 intended to be illustrative of circuit components utilized herein. While a chip package 100 is illustrated, it is to be understood that the circuit and/or the principles described here and throughout this document are applicable to a variety of electronic circuits, including but not limited to printed circuit boards (PCBs), microstrip structures, strip line structures, and the like.

The chip package 100 includes, in an example, a silicon die central processing unit (CPU) 102 communicatively coupled to, in an example, a memory die 104 by way of multiple conductive lines 106. The conductive lines 106 may be any of a variety of conductive lines capable of and configured to transmit electrical signals from a transmitter 108 to a receiver 110, such as copper.

The dies 102, 104 either include a transmitter 108 and a receiver 110 native to the dies 102, 104, as illustrated, or may be attached to an off-die transmitter 108 and receiver 110. The transmitter 108 and receiver 110 themselves variously include or are attached to a matching module 112. As will be described and illustrated herein, the matching module 112 may be a part of a single circuit, with the matching modules 112 illustrated in FIG. 1 being illustrated separately for the purposes of clarity of the figure. In various examples, not all matching modules 112 are part of the same matching module circuit. For instance, the matching modules 112 may combine to form two (2) or more separate matching modules 112 as illustrated herein. The matching modules 112 may be configured to reduce near-end crosstalk on the conductive line 106 to which the matching module 112 is coupled. The matching modules 112 may be configured to operate within a multiconductor transmission line system or bus 114.

As illustrated, the transmitters 108 and receivers 110 illustrated herein variously have or do not have a matching module 112. The various matching modules 112 may be any of a variety of particular matching modules 112 disclosed herein. In various examples, the matching module 112 is utilized with conductive lines 106 of various lengths. A length of the conductive lines 106 may impact the degree to which crosstalk on the line 106 is variously due to far-end crosstalk (FEXT) and near-end crosstalk (NEXT). In various examples, relatively long conductive lines 106 may be relatively more prone to FEXT and relatively short conductive lines 106 may be relatively more prone to NEXT. In various examples, the matching module 112 is applied on unterminated conductive lines 106 of approximately ten (10) millimeters in length or less.

Voltage Signaling—Thevenin Formulation

Figure 2:
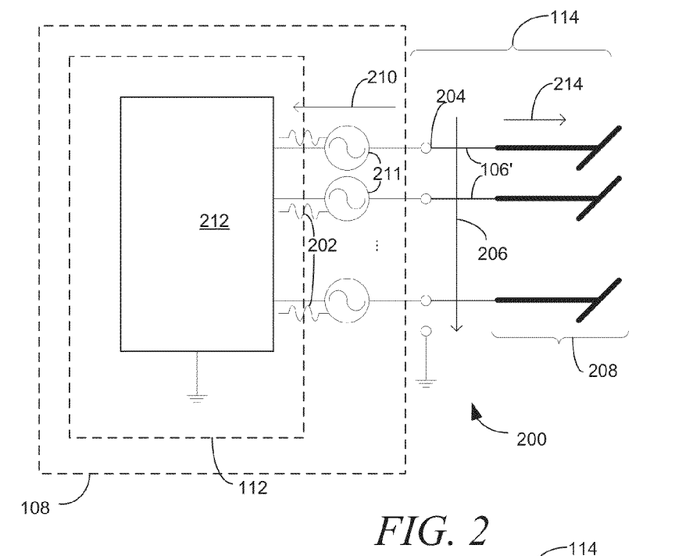
FIG. 2 is a circuit diagram of a circuit that includes a voltage signaling transmitter having a matching module, in an example embodiment.

FIG. 2 is a circuit diagram of a circuit 200 that includes a voltage signaling transmitter 108 having a matching module 112. For illustrative purposes, the circuit 200 is analyzed based on infinitely long conductive lines 106' transmitting electrical signals 202. For infinitely long conductive lines 106', a pad voltage vector at die pads 204 of the die 102 is:

$$\overline{V}(0) = \overline{Z}_c(\overline{Z}_c + \overline{Z}_s)^{-1} \overline{V}_s \quad \text{Equation 1}$$

In Equation 1 and herein, $\overline{V}$ is the pad voltage vector 206 at the die pads 204, $\overline{Z}_c$ is the characteristic impedance matrix 208 of the conductive lines 106' and, in particular, the multiconductor transmission line 114, $\overline{V}_s$ is the source voltage vector 210 over the voltage sources 211, and $\overline{Z}_s$ is the source impedance matrix 212 of the transmitter 108 and die 102 generally. The current vector 214 may give the current for lines 106' connected to the die pads 204 and may be:

$$\overline{I}(0) = (\overline{Z}_c + \overline{Z}_s)^{-1} \overline{V}_s \quad \text{Equation 2}$$

Based on Equation 1, by making $\overline{Z}_s$ proportional to $\overline{Z}_c$, the mixing of voltages across conductive lines 106 may be reduced or substantially eliminated. $\overline{Z}_s$ may be proportional to $\overline{Z}_c$ when there is a scalar x such that $\overline{Z}_s = x \ast \overline{Z}_c$. As a result, near-end crosstalk may be reduced or, depending, for instance, on the closeness of the match between $\overline{Z}_s$ and $\overline{Z}_c$, substantially or entirely eliminated.

Figure 3:
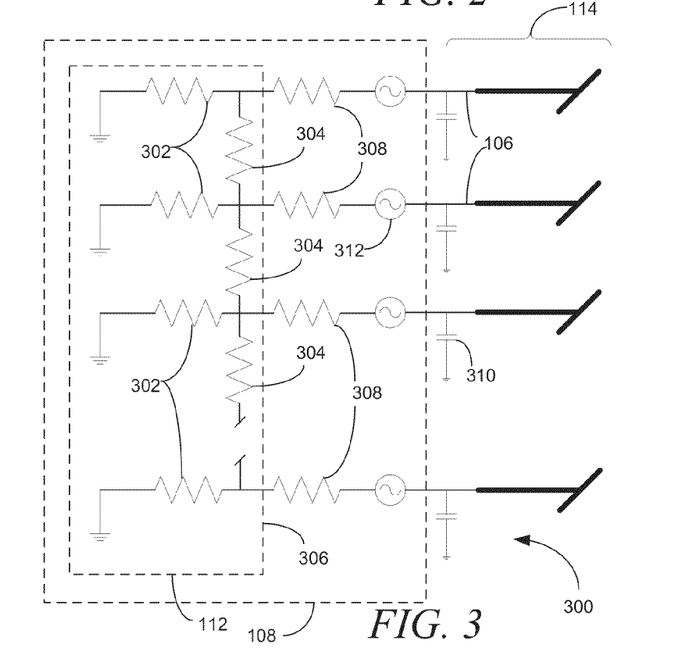
FIG. 3 is a circuit diagram for a transmitter and conductive line, in an example embodiment.

FIG. 3 is a circuit diagram 300 for a transmitter 108 and conductive line 106, in an example embodiment. By making $\overline{Z}_s$ equal or approximately $\overline{Z}_c$, i.e., by matching or substantially matching the impedance matrix between the source impedance of the transmitter 108 and die 102 generally and the characteristic impedance of the multiconductor transmission line 114, reflections from the unterminated receiver 110 may be suppressed or substantially suppressed by absorption at the transmitter 108. Thus, for a multiconductor transmission line 114 with negligible modal skew, such as may arise from a relatively short conductive line 106 having a micro strip or a conductive line with substantially transverse electromagnetic (TEM) wave propagation such as a strip line, crosstalk may be reduced or substantially eliminated.

For multiconductor transmission lines 114 having conductive lines 106 arranged in a substantially co-planar fashion the characteristic admittance matrix $\overline{Y}_c = \overline{Z}_c^{-1}$ may be nearly tridiagonal. Thus, matrix matching as disclosed herein may be accomplished with a similarly tridiagonal $\overline{Y}_s = \overline{Z}_s^{-1}$.

The transmitter 108 includes resistance to ground 302 $R_g$ and coupling resistance 304 $R_c$. In an example $R_g$ is approximately thirty (30) Ohms and $R_c$ is approximately two hundred twenty-five (225) Ohms. $R_g$ and $R_c$ may be part of a matching network with a modified source admittance matrix 306 of:

$$\overline{Y}_s' = [(\overline{Y}_c - \text{diag}\{j\omega_0 C_p\})^{-1} - \text{diag}\{R_s\}]^{-1} \quad \text{Equation 3}$$

In Equation 3, $\omega_0$ is a fundamental angular frequency for a targeted signaling rate (wherein the fundamental frequency $f_0$ is $\omega_0/2\pi$ and the signaling rate is $2f_0$) which may allow for improved matrix matching in the presence of finite source resistance 308 $R_s$ (e.g., from a non-ideal voltage source) and parasitic pad capacitance 310 $C_p$ on the die pads 204. In an example, $C_p$ is approximately 0.5 picofarads. Equation 3 may, in various examples, be utilized to calculate initial estimates for $R_g$ and $R_c$. The estimates may be refined by numerical optimization or other method to maximize various metrics, such as eye height at the receiver 110.

In various examples, eye height is the vertical opening of the "eye" of an eye diagram. An eye diagram may display received waveforms as voltage vs. time by overlaying the waveforms for multiple bit time intervals on top of each other. The eye height may be a measure of noise in the received waveforms, for example due to crosstalk. A sufficiently large eye height may enable a receiver to distinguish a "1" from "0" by comparing a received voltage against a reference voltage.

In various examples, the voltage sensing examples using a Thevenin formulation may produce a matrix matching network in the transmitter or receiver that introduces resistive coupling elements 304 $R_c$ between neighboring conductive lines 106, presenting a tridiagonal admittance matrix, i.e., an admittance matrix with zero or essentially zero admittance for all matrix elements except on its diagonal and the two first sub-diagonals. In various examples, voltage sensing examples using a Thevenin formulation may produce voltage sources 312 connected between the matching module 112 and the die pads 204, in contrast to voltage sources connected between ground and the die pads, i.e., "floating" voltage sources. In various examples, voltage sensing examples using a Thevenin formulation may utilize conductive lines 106 and multiconductor transmission lines 114 that are not predefined with respect to one another, as in multimode signaling, but which rather may operate inherently with respect to neighboring conductive lines 106.

Current Signaling—Norton Formulation

Figures 4, 5:
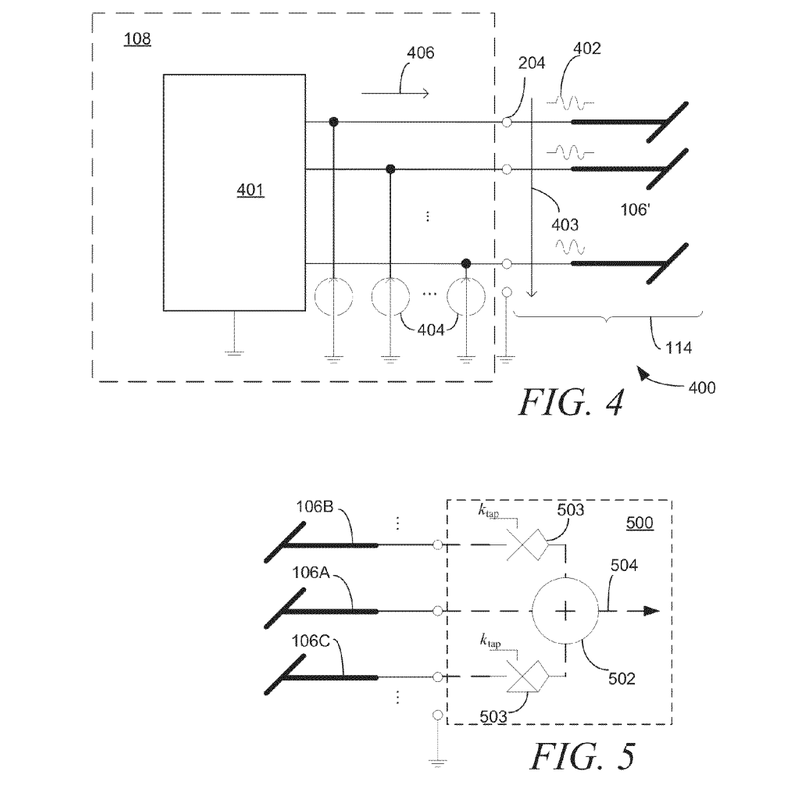
FIG. 4 is a circuit diagram of a circuit that includes a current signaling transmitter having a matching module, in an example embodiment.
FIG. 5 is a circuit diagram of a matching module for a receiver tapping scheme for Norton formulation-based matrix matching, in an example embodiment.

FIG. 4 is a circuit diagram of a circuit 400 that includes a current signaling transmitter 108 having a matching module 401. For illustrative purposes, the circuit 400 is analyzed based on infinitely long conductive lines 106' transmitting electrical signals 402. For infinitely long conductive lines 106', a pad voltage vector 403 at die pads 204 of the die 102 is:

$$\overline{V}(0) = (\overline{Y}_c + \overline{Y}_s)^{-1} \overline{I}_s \quad \text{Equation 4}$$

In Equation 4, $\overline{I}_s$ is the vector of current sources 404 (e.g., electrical signals). The current vector 406 at the die pads 204 is:

$$\overline{I}(0) = \overline{Y}_c(\overline{Y}_c + \overline{Y}_s)^{-1} \overline{I}_s \quad \text{Equation 5}$$

Based on Equation 5, by making $\overline{Y}_s$ proportional to $\overline{Y}_c$, currents may not be "mixed" between conductive lines 106 and such lines may be free or substantially free of current crosstalk. Where conductive lines 106 are of finite length with an unterminated receiver 110, the multiconductor transmission line 114 currents may be received and, in various examples, reflected by the receiver 110 without or substantially without crosstalk between the neighboring conductive lines 106 of the multiconductor transmission line 114. By making $\overline{Y}_s$ equal or approximately equal to $\overline{Y}_c$, i.e., by matching or substantially matching the impedance matrix between the source impedance matrix of the transmitter 108 and die 102 generally and the characteristic impedance matrix of the multiconductor transmission line 114, reflections from the unterminated receiver 110 may be suppressed or substantially suppressed by absorption at the transmitter 108. Thus, for a multiconductor transmission line 114 with negligible modal skew, such as may arise from a relatively short conductive line 106 having a micro strip or a conductive line with substantively transverse electromagnetic (TEM) wave propagation such as a strip line, crosstalk may be reduced or substantially eliminated.

FIG. 5 is a circuit diagram of a matching module 500 for a receiver 110 tapping scheme for Norton formulation-based matrix matching. The matching module 500 may be a tapping circuit. It is to be recognized and understood that, while various examples of matching modules generally may incorporate resistors, the term matching module as used herein may incorporate, for instance, what is illustrated as the matching module 500.

Open lines at the receiver 110 may make incoming electrical current unobservable or comparatively difficult to observe. Accordingly, the electrical signals on the conductive lines 106 may be reconstructed from observed voltages by a mathematical operation, such as multiplication, with the characteristic admittance matrix $\overline{Y}_c$, which may be approximated as tridiagonal, as discussed above. A weighted summation using an adder 502 and scaling circuits 503 to scale voltages on certain conductive lines 106 based on a tapping coefficient $k_{tap}$ as the ratio of off-diagonal admittance to admittance on the diagonal of the characteristic admittance matrix $\overline{Y}_c$ can be used. Note that $k_{tap}$ may be less than zero (0) where the off-diagonal conductances in the characteristic admittance matrix $\overline{Y}_c$ are negative.

As illustrated, the output voltage $V'_k$ is:

$$V'_k = V_k + k_{tap} V_{k+1} + k_{tap} V_{k-1} \quad \text{Equation 6}$$

In equation 6, $V_k$, $V_{k+1}$, and $V_{k-1}$ are voltages on adjacent conductive lines 106A, 106B, 106C, respectively. Such lines are physically adjacent to one another on a layout of the chip package 100. The output voltage $V'_k$ at 504 may also be free or substantially free of crosstalk. As such, data in the electrical signals may be measured using voltage rather than current. Alternatively or additionally, the tapping operation may be a component of the transmitter 108. The signals to be transmitted may be combined with scaled copies of the signals to be transmitted on the nearest neighbor conductive lines 106, where the scaling is accomplished by multiplication with the tapping coefficient $k_{tap}$.

Figure 6:
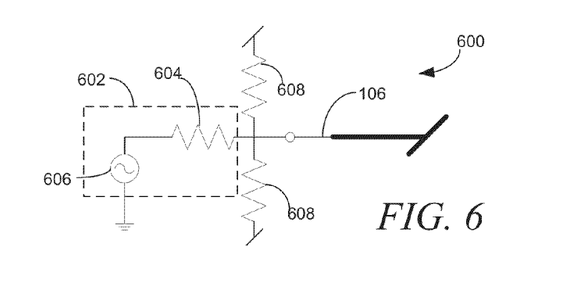
FIG. 6 is a circuit diagram of a circuit including a voltage source for a transmitter, in an example embodiment.

FIG. 6 is a circuit diagram of a circuit 600 including a voltage source 602 for a voltage source 108 (not pictured). The voltage source 602 may be adapted from the circuit 400 of FIG. 4. The voltage source 602 includes making the source resistance 604 $R_s$ equal to the ground resistance $R_g$ as disclosed herein. The voltage source 602 further includes a voltage source 606 based on the product of the current source $I_s$ as disclosed herein and the ground resistance $R_g$.

In various examples, the current signaling Norton formulation may provide for a matrix matching network in the transmitter 108 that introduces resistive coupling 608 $R_c$ between neighboring conductive lines 106, presenting a tridiagonal admittance matrix. In various examples, the current signaling Norton formulation may provide for adding of electrical signals from neighboring conductive lines 106, such as from received voltages, scaled by a tapping coefficient $k_{tap}$ to the neighboring signals at one or both of the receiver 110 or the transmitter 108. In various examples, the current signaling Norton formulation may provide for unbundled conductive lines 106.

Figure 7:
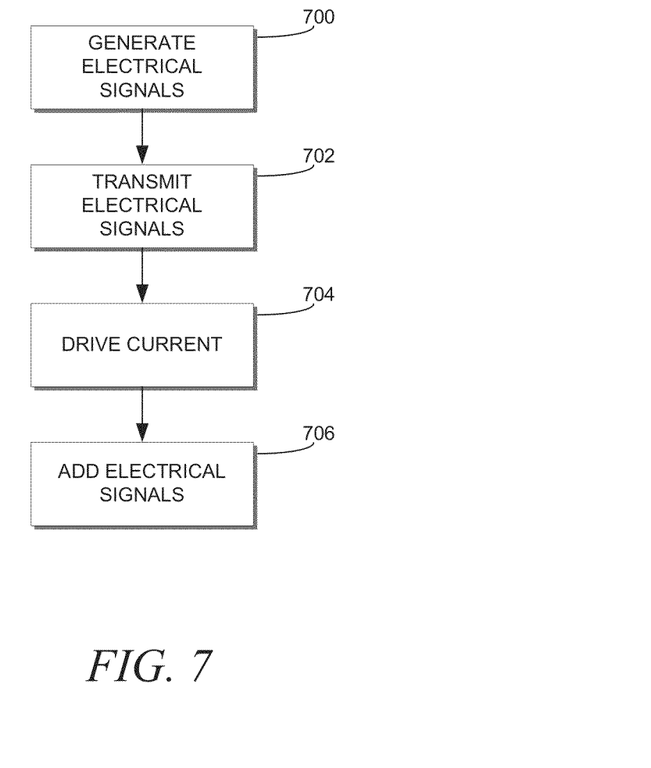
FIG. 7 is a flowchart for transmitting electrical signals along a plurality of conductive lines, in an example embodiment.

FIG. 7 is a flowchart for transmitting electrical signals along a plurality of conductive lines.

At 700, electrical signals are generated with a transmitter.

At 702, the electrical signals are transmitted along a plurality of conductive lines between a first electronic component and a second electronic component between which the plurality of conductive lines are coupled, the plurality of conductive lines being expressable as a characteristic impedance matrix. In an example, a source impedance of the transmitter is expressable as a source impedance matrix based, at least in part, on a resistive coupling between individual ones of the plurality of conductive lines, the source impedance matrix being substantially proportional to the characteristic impedance matrix. In an example, the characteristic impedance matrix is approximately equal to the source impedance matrix of the transmitter.

In an example, the resistive coupling comprises resistive coupling elements, wherein each one of the resistive coupling elements is coupled between individual ones of the plurality of conductive lines. In an example, each of the resistive coupling elements corresponds to one pair of the plurality of conductive lines and each pair of the plurality of conductive lines corresponds to one of the resistive coupling elements. In an example, the resistive coupling elements form a tridiagonal admittance matrix. In an example, the plurality of conductive lines are not terminated. In an example, the transmitter comprises a plurality of voltage sources individually coupled to the resistive coupling and to one of the conductive lines.

At 704, a current is driven with a plurality of current sources over one of the plurality of conductive lines. In an example, wherein the plurality of conductive lines have a first end coupled to the transmitter and a second end, and further include a receiver coupled to the second end of the plurality of conductive lines.

At 706, an electrical signal of a first line of the plurality of conductive lines is added with an adder of the receiver with an electrical signal of a second line of the plurality of conductive lines adjacent to the first line. In an example, adding the electrical signal comprises adding each line of the plurality of conductive lines adjacent to the first line. In an example, the electrical signal of each line of the plurality of conductive lines adjacent to the first line is scaled, with a scaling circuit, based on a tapping coefficient.

Figure 8:
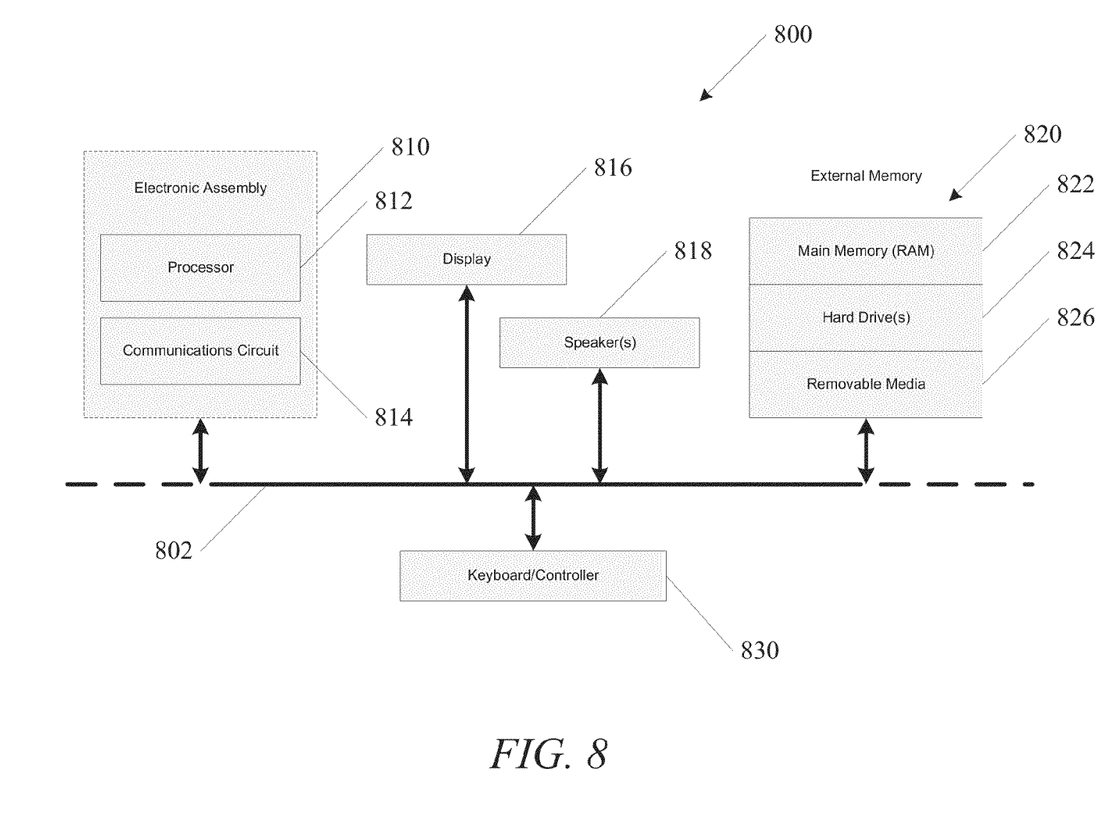
FIG. 8 is a block diagram of an electronic device that can incorporate at least one package, in an example embodiment.

An example of an electronic device using semiconductor chips as described in the present disclosure is included to show an example of a higher level device application for the present invention. FIG. 8 is a block diagram of an electronic device 800 that can incorporate at least one package, such as a package 100 or other package described in examples herein. The electronic device 800 is merely one example of an electronic system in which embodiments of the present invention can be used. Examples of electronic devices 800 include, but are not limited to, personal computers, tablet computers, mobile telephones, personal data assistants, MP3 or other digital music players, etc. In this example, the electronic device 800 comprises a data processing system that includes a system bus 802 to couple the various components of the system. The system bus 802 provides communications links among the various components of the electronic device 800 and can be implemented as a single bus, as a combination of busses, or in any other suitable manner.

An electronic assembly 810 is coupled to the system bus 802. The electronic assembly 810 can include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 810 are a custom circuit, an application-specific integrated circuit (ASIC), or the like, such as, for example, one or more circuits (such as a communications circuit 814) for use in wireless devices like mobile telephones, pagers, personal data assistants, portable computers, two-way radios, and similar electronic systems. The IC can perform any other type of function.

The electronic device 800 can also include an external memory 820, which in turn can include one or more memory elements suitable to the particular application, such as a main memory 822 in the form of random access memory (RAM), one or more hard drives 824, and/or one or more drives that handle removable media 826 such as compact disks (CD), digital video disk (DVD), and the like.

The electronic device 800 can also include a display device 816, one or more speakers 818, and a keyboard and/or controller 830, which can include a mouse, trackball, touch screen, voice-recognition device, or any other device that permits a system user to input information into and receive information from the electronic device 800.

ADDITIONAL EXAMPLES

Example 1 includes a circuit, device, or system that includes a plurality of conductive lines configured to transmit electrical signals between a first electronic component and a second electronic component between which the plurality of conductive lines are coupled, and a transmitter, configured to generate the electrical signals, the transmitter including a source impedance based, at least in part, on a resistive coupling between individual ones of the plurality of conductive lines, a source impedance matrix of the source impedance being substantially proportional to the characteristic impedance matrix of the plurality of conductive lines.

Example 2 includes the subject matter of Example 1 and further includes that the characteristic impedance matrix is approximately equal to the source impedance matrix of the transmitter.

Example 3 includes the subject matter of any one or more of Examples 1 and 2 and further includes that the resistive coupling comprises resistive coupling elements, wherein each one of the resistive coupling elements is coupled between individual ones of the plurality of conductive lines.

Example 4 includes the subject matter of any one or more of Examples 1-3 and further includes that each of the resistive coupling elements corresponds to one pair of the plurality of conductive lines and each pair of the plurality of conductive lines corresponds to one of the resistive coupling elements.

Example 5 includes the subject matter of any one or more of Examples 1-4 and further includes that the resistive coupling elements form a tridiagonal admittance matrix.

Example 6 includes the subject matter of any one or more of Examples 1-5 and further includes that the plurality of conductive lines are not terminated.

Example 7 includes the subject matter of any one or more of Examples 1-6 and further includes that the transmitter comprises a plurality of voltage sources individually coupled to the resistive coupling and to one of the conductive lines.

Example 8 includes the subject matter of any one or more of Examples 1-7 and further includes a plurality of current sources, each current source being configured to drive a current over one of the plurality of conductive lines.

Example 9 includes the subject matter of any one or more of Examples 1-8 and further includes that the plurality of conductive lines have a first end coupled to the transmitter and a second end, and further includes a receiver coupled to the second end of the plurality of conductive lines, wherein the receiver comprises an adder configured to add an electrical signal of a first line of the plurality of conductive lines with an electrical signal of a second line of the plurality of conductive lines adjacent to the first line.

Example 10 includes the subject matter of any one or more of Examples 1-9 and further includes that the adder is configured to add the electrical signal of each line of the plurality of conductive lines adjacent to the first line.

Example 11 includes the subject matter of any one or more of Examples 1-10 and further includes a scaling circuit configured to scale the electrical signal of each line of the plurality of conductive lines adjacent to the first line based on a tapping coefficient.

Example 12 includes the subject matter of any one or more of Examples 1-11 and further includes that the conductive lines are less than approximately ten (10) millimeters long.

Example 13 includes a method that may be performed on a circuit, device or system and includes generating, with a transmitter, electrical signals, and transmitting the electrical signals along a plurality of conductive lines between a first electronic component and a second electronic component between which the plurality of conductive lines are coupled. A source impedance of the transmitter is based, at least in part, on a resistive coupling between individual ones of the plurality of conductive lines, a source impedance matrix of the source impedance being substantially proportional to a characteristic impedance matrix of the plurality of conductive lines.

Example 14 includes the subject matter of Example 13 and further includes that the characteristic impedance matrix is approximately equal to the source impedance matrix of the transmitter.

Example 15 includes the subject matter of any one or more of Examples 13 and 14 and further includes that the resistive coupling comprises resistive coupling elements, wherein each one of the resistive coupling elements is coupled between individual ones of the plurality of conductive lines.

Example 16 includes the subject matter of any one or more of Examples 13-15 and further includes that each of the resistive coupling elements corresponds to one pair of the plurality of conductive lines and each pair of the plurality of conductive lines corresponds to one of the resistive coupling elements.

Example 17 includes the subject matter of any one or more of Examples 13-16 and further includes that the resistive coupling elements form a tridiagonal admittance matrix.

Example 18 includes the subject matter of any one or more of Examples 13-17 and further includes that the plurality of conductive lines are not terminated.

Example 19 includes the subject matter of any one or more of Examples 13-18 and further includes that the transmitter comprises a plurality of voltage sources individually coupled to the resistive coupling and to one of the conductive lines.

Example 20 includes the subject matter of any one or more of Examples 13-19 and further includes driving, with a plurality of current sources, a current over one of the plurality of conductive lines.

Example 21 includes the subject matter of any one or more of Examples 13-20 and further includes that the plurality of conductive lines have a first end coupled to the transmitter and a second end, and further includes a receiver coupled to the second end of the plurality of conductive lines, further including adding, with an adder of the receiver, an electrical signal of a first line of the plurality of conductive lines with an electrical signal of a second line of the plurality of conductive lines adjacent to the first line.

Example 22 includes the subject matter of any one or more of Examples 13-21 and further includes that adding the electrical signal comprises adding each line of the plurality of conductive lines adjacent to the first line.

Example 23 includes the subject matter of any one or more of Examples 13-22 and further includes scaling, with a scaling circuit, the electrical signal of each line of the plurality of conductive lines adjacent to the first line based on a tapping coefficient.

Example 24 includes the subject matter of any one or more of Examples 13-23 and further includes that the conductive lines are less than approximately ten (10) millimeters long.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electrical circuit, comprising:
   a plurality of conductive lines configured to transmit electrical signals between a first electronic component and a second electronic component between which the plurality of conductive lines are coupled;
   a transmitter, configured to generate the electrical signals, the transmitter including a source impedance based, at least in part, on a resistive coupling between individual ones of the plurality of conductive lines, a source impedance matrix of the source impedance being substantially proportional to a characteristic impedance matrix of the plurality of conductive lines;
   wherein the resistive coupling comprises resistive coupling elements, wherein each one of the resistive coupling elements is coupled between individual ones of the plurality of conductive lines;
   wherein each of the resistive coupling elements corresponds to one pair of the plurality of conductive lines and each pair of the plurality of conductive lines corresponds to one of the resistive coupling elements; and
   wherein the resistive coupling elements form a tridiagonal admittance matrix.

2. The electrical circuit of claim 1, wherein the characteristic impedance matrix is approximately equal to the source impedance matrix of the transmitter.

3. The electrical circuit of claim 1, wherein the plurality of conductive lines are not terminated.

4. The electrical circuit of claim 1, wherein the transmitter comprises a plurality of voltage sources individually coupled to the resistive coupling and to one of the conductive lines.

5. The electrical circuit of claim 1, further comprising a plurality of current sources, each current source being configured to drive a current over one of the plurality of conductive lines.

6. An electrical circuit, comprising:
   a plurality of conductive lines configured to transmit electrical signals between a first electronic component and a second electronic component between which the plurality of conductive lines are coupled;
   a transmitter, configured to generate the electrical signals, the transmitter including a source impedance based, at least in part, on a resistive coupling between individual ones of the plurality of conductive lines, a source impedance matrix of the source impedance being substantially proportional to a characteristic impedance matrix of the plurality of conductive lines; and a plurality of current sources each current source being configured to drive a current over one of the plurality of conductive lines;

wherein the plurality of conductive lines have a first end coupled to the transmitter and a second end, and further comprising a receiver coupled to the second end of the plurality of conductive lines, wherein the receiver comprises an adder configured to add an electrical signal of a first line of the plurality of conductive lines with an electrical signal of a second line of the plurality of conductive lines adjacent to the first line.

7. The electrical circuit of claim 6, wherein the adder is configured to add the electrical signal of each line of the plurality of conductive lines adjacent to the first line.

8. The electrical circuit of claim 7, further comprising a scaling circuit configured to scale the electrical signal of each line of the plurality of conductive lines adjacent to the first line based on a tapping coefficient.

9. The electrical circuit of claim 6, wherein the characteristic impedance matrix is approximately equal to the source impedance matrix of the transmitter.

10. A method, comprising:
generating, with a transmitter, electrical signals; and
transmitting the electrical signals along a plurality of conductive lines between a first electronic component and a second electronic component between which the plurality of conductive lines are coupled;
wherein a source impedance of the transmitter is based, at least in part, on a resistive coupling between individual ones of the plurality of conductive lines, a source impedance matrix of the source impedance being substantially proportional to the characteristic impedance matrix of the plurality of conductive lines;
wherein e resistive coupling comprises resistive coupling elements, wherein each one of the resistive coupling elements is coupled between individual ones of the plurality of conductive lines;
wherein each of the resistive coupling elements corresponds to one pair of the plurality of conductive lines and each pair of the plurality of conductive lines corresponds to one of the resistive coupling elements; and
wherein the resistive coupling elements form a tridiagonal admittance matrix.

11. The method of claim 10, wherein the characteristic impedance matrix is approximately equal to the source impedance matrix of the transmitter.

12. The method of claim 10, wherein the plurality of conductive lines are not terminated.

13. The method of claim 10, wherein the transmitter comprises a plurality of voltage sources individually coupled to the resistive coupling and to one of the conductive lines.

14. The method of claim 10, further comprising driving, with a plurality of current sources, a current over one of the plurality of conductive lines.

15. A method, comprising:
generating, with a transmitter, electrical signals;
transmitting the electrical signals along a plurality of conductive lines between a first electronic component and a second electronic component between which the plurality of conductive lines are coupled; and
driving, with a plurality of current sources, a current over one of the plurality of conductive lines
wherein a source impedance of the transmitter is based, at least in part, on a resistive coupling between individual ones of the plurality of conductive lines, a source impedance matrix of the source impedance being substantially proportional to the characteristic impedance matrix of the plurality of conductive lines;
wherein the plurality of conductive lines have a first end coupled to the transmitter and a second end, and further comprising a receiver coupled to the second end of the plurality of conductive lines, further comprising adding, with an adder of the receiver, an electrical signal of a first line of the plurality of conductive lines with an electrical signal of a second line of the plurality of conductive lines adjacent to the first line.

16. The method of claim 15, wherein adding the electrical signal comprises adding each line of the plurality of conductive lines adjacent to the first line.

17. The method of claim 16, further comprising scaling, with a scaling circuit, the electrical signal of each line of the plurality of conductive lines adjacent to the first line based on a tapping coefficient.

18. The method of claim 15, wherein the characteristic impedance matrix is approximately equal to the source impedance matrix of the transmitter.

* * * * *

UNITED STATES PATENT AND TRADEMARK OFFICE
CERTIFICATE OF CORRECTION

| | | |
|---|---|---|
| PATENT NO. | : 9,093,990 B2 | Page 1 of 1 |
| APPLICATION NO. | : 14/031438 | |
| DATED | : July 28, 2015 | |
| INVENTOR(S) | : Henning Braunisch | |

It is certified that error appears in the above-identified patent and that said Letters Patent is hereby corrected as shown below:

In the claims

In column 11, line 3, in Claim 6, delete "sources" and insert --sources,--, therefor     In column 11, line 36, in Claim 10, delete "e" and insert --the--, therefor     In column 12, line 19, in Claim 15, after "lines", insert --;--, therefor Signed and Sealed this
Seventh Day of June, 2016

Michelle K. Lee
*Director of the United States Patent and Trademark Office*